United States Patent [19]
Garbe et al.

[11] Patent Number: 4,904,927
[45] Date of Patent: Feb. 27, 1990

[54] METHOD FOR MEASURING A CHARACTERISTIC IMPEDANCE AND A PROPAGATION CONSTANT OF A TWO-PORT NETWORK

[75] Inventors: Heyno Garbe, Baden; Diethard Hansen, Berikon, both of Switzerland

[73] Assignee: BBC Brown Boveri AG, Baden, Switzerland

[21] Appl. No.: 288,421

[22] Filed: Dec. 22, 1988

[30] Foreign Application Priority Data

Dec. 23, 1987 [CH] Switzerland .................. 5013/87

[51] Int. Cl.$^4$ ........................................... G01R 27/32
[52] U.S. Cl. ..................................... 324/642; 324/637
[58] Field of Search ................. 324/57 R, 58 B, 58 R, 324/58.5 B, 58.5 R

[56] References Cited

U.S. PATENT DOCUMENTS

| | | | |
|---|---|---|---|
| 3,715,667 | 2/1973 | Nicolson | 324/58.5 B |
| 3,771,056 | 11/1973 | Zimmerman | 324/57 R |
| 4,156,842 | 5/1979 | Huang | 324/57 R |
| 4,463,308 | 7/1984 | Underhill | 324/57 R |
| 4,621,226 | 11/1986 | Powell | 324/57 R |
| 4,777,429 | 10/1988 | Potter | 324/58 B |

FOREIGN PATENT DOCUMENTS 2417941 10/1975 Fed. Rep. of Germany.

OTHER PUBLICATIONS

Oliver: "Time Domain Reflectometry"-hp Journal-Feb. 1964, pp. 1-8.
News from Rohde & Schwarz, vol. 118, Summer 1987. Transmission Loss—Determined by Reflection Measurement, T. Reichel, p. 21, see the whole document.

*Primary Examiner*—Reinhard J. Eisenzopf
*Assistant Examiner*—Jose M. Solis
*Attorney, Agent, or Firm*—Oblon, Spivak, McClelland, Maier & Neustadt

[57] ABSTRACT

In a method for measuring a characteristic impedance and a propagation constant of a two-port network (2), an output port (5) of the two-port network (2) is successively terminated with at least two different finite known impedances (3a, 3b) which are independent of the two-port network (2). An input impedance (ZE1, ZE2) is measured for each residual impedance. From the termination impedances (ZA1, ZA2) of the impedances (3a, 3b) and the corresponding input impedances (ZE1, ZE2), the propagation constant and the characteristic impedance are determined.

6 Claims, 1 Drawing Sheet

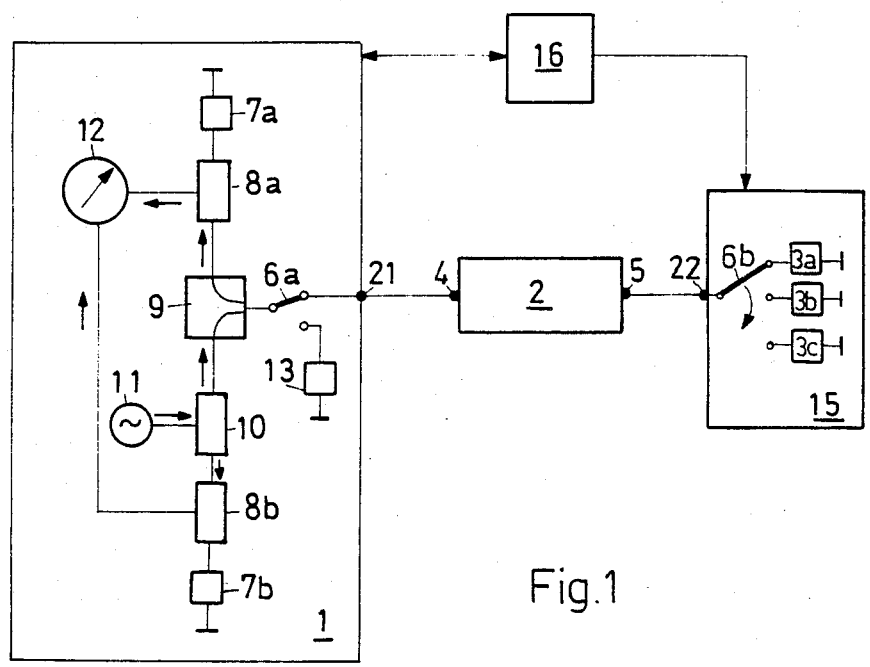
Fig.1
Fig.2a
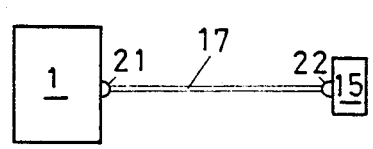
Fig.2b
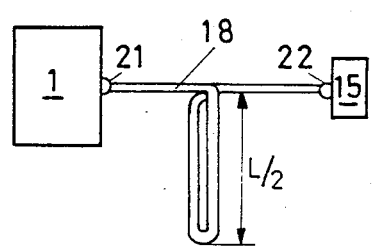
Fig.3a
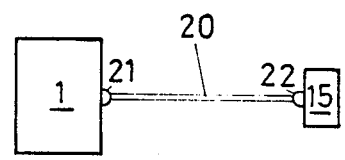
Fig.3b
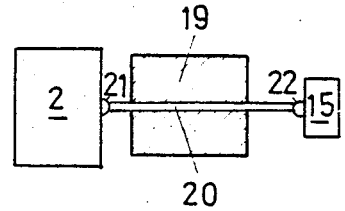

METHOD FOR MEASURING A CHARACTERISTIC IMPEDANCE AND A PROPAGATION CONSTANT OF A TWO-PORT NETWORK

BACKGROUND OF THE INVENTION

1. Field of the Invention

The invention relates to a method for measuring a characteristic impedance and a propagation constant of a two-port network, in which method at least two input impedances are measured by means of a reflection measuring instrument at an input port of the two-port network with at least two different predetermined terminations of an output port of the two-port network and from the at least two input impedances a characteristic impedance and a propagation constant are determined.

2. Discussion of Background

In the transmission of radio-frequency signals, it is absolutely necessary that the characteristics of the transmission link be accurately known in order to be able to match terminal devices (for example transmitters and receivers) and transmission link to one another. This is the only way in which reliable signal transmission can be ensured.

It is known that the characterisics of a linear two-port network are essentially given by the two quantities of characteristic impedance and propagation constant. These quantities can be determined, for example with the aid of a reflection measurement. A corresponding method is disclosed, for example, in the printed document "Durchgangsdämpfung—ermittelt über Reflexionsmessung" (transmission loss—determined by reflection measurement), Neues von Rohde+Schwarz 118, summer 1987. In this method a signal wave is coupled via an input port into the two-port network to be measured, passes through the two-port network, is totally reflected at an output port and returns to the input port of the two-port network where it is then measured. In this manner, two input impedances are measured, the total reflection at the output port being determined, on the one hand, by a short-circuit and, on the other hand, by an open circuit.

The advantage of the reflection measurement lies in the fact that the signal wave is measured at the same location where it is generated. Since, in addition, only an input port of the two-port network needs to be connected to the measuring instrument, for example installed cables can also be measured without difficulties.

However, problems occur in the known measuring method if a frequency range of 100 MHz and more is to be used as operating frequency. This is because it has been found to be difficult to implement good short circuits or open circuits, respectively, at such frequencies. As a consequence, the total reflection is disturbed and the measurement results become very inaccurate.

SUMMARY OF THE INVENTION

The present invention has the object of creating a method for measuring a characteristic impedance and a propagation constant of a two-port network, in which at least two input impedances are measured by means of a reflection measuring instrument at an input port of the two-port network with at least two different, predetermined terminations of an output port of the two-port network and from the at least two input impedances a characteristic impedance and a propagation constant are determined, which method also operates with high accuracy at high measuring frequencies, particularly at 100 MHz and more.

According to the invention, the solution consists of the fact that the at least two terminations are known finite residual impedances which are independent of the two-port network.

The core of the invention must be seen in the fact that the total reflection, which it is difficult to implement, is replaced by a partial reflection of known dimension. Short circuit and open circuit are replaced by residual impedances which are distinctly greater than zero and less than infinity. The impedances are basically independent of the two-port network, that is to say that generally they are not matched.

A further advantage of the invention can be seen in the fact that, by a suitable choice of the impedances, the measuring signals can be restricted without additional effort to a measuring range suitable for a measuring instrument used.

BRIEF DESCRIPTION OF THE DRAWING

In the text which follows, the invention will be explained in greater detail with reference to illustrative embodiments and in conjunction with the drawing, in which:

FIG. 1 shows an arrangement for measuring a characteristic impedance and a propagation constant of a two-port network;

FIGS. 2A and 2B show steps of a method for measuring a characteristic impedance and a propagation constant of a line and FIGS. 3A and 3B show steps of a method for measuring a characteristic impedance and a propagation constant of an absorber medium.

DESCRIPTION OF THE PREFERRED EMBODIMENTS

FIG. 1 shows an arrangement for carrying out the method according to the invention. It comprises a reflection measuring instrument 1, impedance selection circuit 15 and an computing circuit 16.

The reflection measuring instrument 1 is known as such, for example from the printed document by Rhode+Schwarz initially mentioned. A signal generator 11 generates a signal wave of a known frequency. This signal wave passes, on the one hand as a measuring wave via a coupling-in device 10 and a reflection coefficient bridge 9 to a switch 6a and, on the other hand as reference wave via a measuring adaptor 8b to a vector voltmeter 12. A part of the measuring wave reflected during a measurement passes via the reflection coefficient bridge 9 and a measuring adaptor 8a to the vector voltmeter 12.

Between the reflection coefficient bridge 9 and an output 21 of the reflection measuring instrument 1, the switch 6a is arranged. It connects the reflection coefficient bridge 9 either to the output 21 or to a calibration termination 13.

Two measuring adaptors 8a and 8b are in each case terminated on one side with a waveguide termination 7a and 7b, respectively, which can be constructed, for example, as 50-ohm resistors.

The impedance selection circuit 15 comprises, for example, 3 residual impedances 3a, 3b, 3c and a switch 6b. The switch 6b can be used to connect an input 22 of the impedance selection circuit 15 optionally to one of the 3 impedances 3a, 3b, 3c.

The computing circuit 16 which is provided in this illustrative embodiment controls, on the one hand, the switch 6b of the impedance selection circuit 15 and, on the other hand, the reflection measuring instrument 1. It controls the operating condition, stores input impedances measured by the vector voltmeter 12 and determines from these the characteristic impedance and the propagation constant.

A two-port network 2 to be measured is connected with an input port 4 to the output 21 of the reflection measuring instrument 1 and with an output port 5 to the input 22 of the impedance selection circuit 15.

The characterizing feature of the invention is embodied in the impedances 3a, 3b, 3c which form the termination of the output port 5. These are no longer zero (short circuit) and infinite (open circuit) as previously but known impedances which are independent of the two-port network 2 and are finite. In the illustrative embodiment described, the impedances 3a, 3b, 3c have resistance values of 27 ohm, 50 ohm and 68 ohm, respectively. Naturally, the resistance values can largely be stipulated to be any values. However, it is certainly an advantage if they are not too close to one another.

In the arrangement shown in FIG. 1, the method according to the invention proceeds in 6 steps.

Firstly, the reflection measuring instrument 1, or, more accurately, the vector voltmeter 12 is calibrated. For this purpose, the switch 6a is placed in a position in which it connects the reflection coefficient bridge 9 to the calibration termination 13. The measuring wave of the signal generator 11 then passes via the coupling-in device 10 and the reflection coefficient bridge 9 to the calibration termination 13, is totally reflected there, and passes via the reflection coefficient bridge 9 and the measuring adaptor 8a to the vector voltmeter 12.

An impedance value measured in this manner is used as zero level basis for the following impedance values.

Secondly, the impedances 3a, 3b, 3c are individually measured in accordance with a preferred embodiment of the invention.

The input 22 of the impedance selection circuit 15 is directly connected to the output 21 of the reflection measuring instrument 1 (the switch 6a is now in the position in which it connects the reflection coefficient bridge 9 to the output 21 of the reflection measuring instrument 1). All existing impedances 3a, 3b, 3c are successively selected with the switch 6b and a termination impedance ZA1, ZA2, ZA3 is measured for each. The computing circuit 16 stores the termination impedances ZA1, ZA2, ZA3 supplied by the vector voltmeter 12.

Thirdly, the two-port network 2 is connected with an input 4 to the output 21 of the reflection measuring instrument 1 and with an output port 5 to the input 22 of the impedance selection circuit 15.

Fourthly, three input impedances ZE1, ZE2, ZE3 of the two-port network 2 are measured, each position of the switch 6b corresponding to a given, known termination of the output port 5 of the two-port network 2. The 3 input impedances ZE1, ZE2, ZE3 are again passed by the vector voltmeter 12 to the computing circuit 16 where they are stored.

Fifthly, the characteristic impedance of the two-port network 2 is determined from the input impedances ZE1, ZE2, ZE3 (and the known residual RMS impedances ZA1, ZA2, ZA3). This is done in the computing circuit 16. In order to be able to determine the characteristic impedance, at least two pairs of ZE1/ZA1, ZE2/ZA2 values (that is to say at least two input impedances ZE1, ZE2 with the corresponding residual RMS impedances ZA1, ZA2) must be available. If there are more than two, a plurality of preliminary characteristic impedances ZW1, ZW2 are calculated from these and a final characteristic impedance ZW is determined from these by averaging which has a lower measurement error than the preliminary characteristic impedances ZW1, ZW2.

According to a preferred embodiment of the invention, there are three pairs of ZE1/ZA1, ZE2/ZA2, ZE3/ZA3 values. From two of each of these a corresponding preliminary characteristic impedance ZW1, ZW2, ZW3 is in each case calculated. The first preliminary characteristic impedance ZW1 will be used to show how the characteristic impedance is calculated in accordance with the invention from two pairs of ZE1/ZA1, ZE2/ZA2 values in the general case. A relation of the type $$ZW1 = \sqrt{\frac{ZA1 \cdot ZE1 \cdot (ZA2 - ZE2) - ZA2 \cdot ZE2 \cdot (ZA1 - ZE1)}{(ZA2 - ZE2) - (ZA1 - ZE1)}} \quad (I)$$

is used, where $$\left.\begin{array}{l}ZE1 = \\ ZE2 = \end{array}\right\} \text{Input impedance for termination} \left(\begin{array}{l}ZA1 \\ ZA2\end{array}\right.$$

Please note that generally the input impedances ZE1, ZE2 and the termination impedances ZA1, ZA2, and thus also the characteristic impedance ZW1 have complex values.

Analogously, the preliminary characteristic impedances ZW2 and ZW3 are formed from the remaining combinations of two pairs of values.

The final characteristic impedance ZW is obtained as mean value of the three preliminary characteristic impedances ZW1, ZW2, ZW3.

Sixthly, a propagation constant g is finally determined. It, too, can be basically calculated from two pairs of ZE1/ZA1, ZE2/ZA2 values. Analogously to the above, however, more than two pairs of values can be used for reducing the measurement error of the propagation constant g with the aid of averaging.

For each of the three pairs of ZE1/ZA1, ZE2/ZA2, ZE3/ZA3 values, a preliminary propagation constant g1, g2, g3 is calculated. Using the first pairs of values ZE1/ZA1, it will be shown again how a propagation constant is generally calculated in accordance with the invention from two pairs of values (or from one characteristic impedance ZW1 and one of the two pairs of values ZE1/ZA1, ZE2/ZA2 used as a basis). A relation of the type $$g1 = \frac{1}{2L} \ln \frac{(ZW1 + ZE1)(ZW1 - ZA1)}{(ZW1 - ZE1)(ZW1 + ZA1)} \quad (II)$$

is used, where
L = length
ln = natural logarithm
ZW1 = characteristic impedance from formula (I)

The following should be noted with respect to the length L of the two-port network 2: if the two-port network 2 is a line (for example a coaxial cable), the length of the measured line must be inserted for the length L so that the propagation constant g1 designates a loss and a phase rotation per unit length. If, in contrast, the two-port network 2 cannot be characterized by a length, L=1 should be set.

In the text which follows, preferred embodiments of the invention are described which demonstrate the versatility of the method according to the invention.

Firstly, a method will be described by means of which the characteristic impedance and the propagation constant of a line can be determined in a simple and, at the same time accurate manner.

FIGS. 2A and B show the essential steps for carrying out the corresponding method. A reflection measuring instrument 1, a impedance selection circuit 15 and a computing circuit 16, not shown in FIGS. 2A and B, are assumed to be constructed as described above, for example. A short line 17 is connected with given connection plugs, on the one hand, to the output 21 of the reflection measuring instrument 1 and, on the other hand, to the input 22 of the residual impedance selection circuit 15. However, the short line 17 does not embody the two-port network 2 shown in FIG. 1. Instead, it forms, together with the impedances 3a, 3b, 3c, in each case an actual impedance for subsequent measurements still to be described.

For each of the three residual impedances 3a, 3b, 3c, a termination impedance ZA1, ZA2, ZA3 is measured. The short line 17 is then replaced by a long a line 18. Attention must be paid to the fact that both lines are provided with identical connection plugs. The long line 18 is longer by a length L than the short line 17. For each of the impedances 3a, 3b, 3c, an input impedance ZE1, ZE2, ZE3 of the long line 18 is measured. From the three pairs of ZE1/ZA1, ZE2/ZA2, ZE3/ZA3 values, a characteristic impedance ZW and a propagation constant g is determined in the manner previously described.

In the embodiment of the invention described, the crucial point is the fact that firstly all unwanted influences (reflection at connection plugs, relays and similar) are eliminated by making a differential measurement. It is important that the short line 17 differs from the long line 18 only by its length. In this case, only the characteristics of the additional piece of line of length L are then measured. This actually embodies the two-port network 2 of FIG. 1.

The method according to the invention is also suitable for measuring characteristic impedance and propagation constant of a dielectric, for example of an absorber medium.

FIGS. 3A and B show the essential steps in carrying out a method according to the invention for measuring characteristic impedance and propagation constant of an absorber medium. Completely analogously to FIGS. 2A and B, a reflection measuring instrument 1, an impedance selection circuit 15 and a computing circuit 16, not shown in FIGS. 3A and B, are used. The output 21 of the reflection measuring instrument 1 is connected, for example by means of two parallel line wires 20 to the input 22 of the impedance selection circuit 15. The parallel line wires 20 are surrounded by a dielectric, for example air (FIG. 3A).

For each of the three impedances 3a, 3b, 3c, a termination impedance ZA1, ZA2, ZA3 is measured. The parallel line wires 20 are then placed in an absorber medium 19 (FIG. 3B). Now three input impedances ZE1, ZE2, ZE3 are measured. The characteristic impedance and the propagation constant of the absorber medium 19 are again obtained from the three pairs of ZE1/ZA1, ZE2/ZA2, ZE3/ZA3 values analogously to the previously described illustrative embodiment.

This, too, is a differential measurement, so to say. The differences between termination impedance ZA1 and input impedance ZE1 are only attributable to the fact that the absorber medium dielectric has been exchanged for the air dielectric.

Although the previously described illustrative embodiments and arrangements for carrying out the method according to the invention represent particularly advantageous embodiments, they do not restrict the invention in any way.

An impedance selection circuit 15 can comprise an arbitrary number of impedances 3a, 3b, . . . . However, there must be at least two different finite impedances 3a, 3b. In accordance with the laws of statistics, the greater the number of measurements the smaller the resultant error of the characteristic impedance ZW and of the propagation constant g.

A computing circuit 16 is actually not necessary. However, it allows the method according to the invention to be carried out fully automatically and thus contributes to the operating ease of the arrangement. If the computing circuit 16 is omitted, the impedance selection circuit 15 with the switch 6b can also be replaced by manual manipulation. For example, the various impedances 3a, 3b . . . are in each case connected by hand.

Naturally, it is not mandatory to determine both characteristic impedance and propagation constant. However, even if only the propagation constant is of interest, it is simpler in practice first to calculate a characteristic impedance according to formula (I) and then to insert this value into formula (II). In conclusion, it can be said that the invention provides a method by means of which characteristic impedance and propagation constant of a two-port network can be determined with high accuracy.

What is claimed as new and desired to be secured by Letters Patent of the United States is:

1. Method for measuring a characteristic impedance and a propagation constant of a two-port network, which method comprises the steps of:
   measuring at least two input impedances ZE1, ZE2 by means of a reflection measuring instrument at an input port of the two-port network with at least two different terminations of an output port of the two-port network; and
   determining from the at least two input impedances ZE1, ZE2 the characteristic impedance ZW and the propagation constant g; wherein:
   known finite impedances, which are independent of the two-port network, are used as terminations of the output port; and
   for measuring the characteristic impedance and the propagation constant of a line, the terminations of the two-port network are measured by themselves, wherein said network is exclusively a line and said terminations comprise connecting plugs and a short section of the line.

2. Method for measuring a characteristic impedance and a propagation constant of a two-port network, which method comprises the steps of:
   measuring at least two input impedances ZE1, ZE2 by means of a reflection measuring instrument at an input port of the two-port network with at least two different terminations of an output port of the two-port network; and determining from the at least two input impedances ZE1, ZE2 the characteristic impedance ZW and the propagation constant g; wherein:

known finite impedances, which are independent of the two-port network, are used as terminations of the output port;

for measuring the characteristic impedance and the propagation constant of a line, the terminations of the two-port network are measured by themselves, wherein said network is exclusively a line and said terminations comprise connecting plugs and a short section of the line; and wherein, for measuring the terminations separately:

a short line having given connecting plugs is connected to the reflection measuring instrument;

successively at least two finite impedances are connected to the short line, in each case an actual termination impedance being measured; and wherein, for measuring the input impedances:

the short line is replaced by a long line having the same connection plugs and in each case an input impedance is measured for the at least two finite impedances.

3. Method for measuring a characteristic impedance and a propagation constant of a two-port network, which method comprises the steps of:

measuring at least two input impedances ZE1, ZE2 by means of a reflection measuring instrument at an input port of the two-port network with at least two different terminations of an output port of the two-port network; and determining from the at least two input impedances ZE1, ZE2 the characteristic impedance ZW and the propagation constant g; wherein:

known finite impedances, which are independent of the two-port network, are used as terminations of the output port; and for measuring the characteristic impedance and the propagation constant of an absorber medium, the terminations of the two-port network are measured by themselves, wherein said terminations comprise parallel line wires and said network is the absorber medium surrounding the parallel line wires.

4. Method for measuring a characteristic impedance and a propagation constant of a two-port network, which method comprises the steps of:

measuring at least two input impedances ZE1, ZE2 by means of a reflection measuring instrument at an input port of the two-port network with at least two different terminations of an output port of the two-port network; and determining from the at least two input impedances ZE1, ZE2 the characteristic impedance ZW and the propagation constant g; wherein:

known finite impedances, which are independent of the two-port network, are used as terminations of the output port;

for measuring the characteristic impedance and the propagation constant of an absorber medium, the terminations of the two-port network are measured by themselves, wherein said terminations comprise parallel line wires and said network is the absorber medium surrounding the parallel line wires; and wherein, for measuring the terminations:

two parallel line wires having given connecting plugs are connected to the reflection measuring instrument;

successively at least two finite impedances are connected to the parallel line wires, in each case an actual termination impedance being measured; and wherein, for measuring the input impedances:

the parallel line wires are placed in an absorber medium and in each case an input impedance is measured for the at least two finite impedances.

5. Method as claimed in claims 1, 2, 3 or 4, wherein for determining the characteristic impedance ZW and the propagation constant g from the measured input impedances, two relations of the following type are used:

$$ZW = \sqrt{\frac{ZA1 \cdot ZE1 \cdot (ZA2 - ZE2) - ZA2 \cdot ZE2 \cdot (ZA1 - ZE1)}{(ZA2 - ZE2) - (ZA1 - ZE1)}}$$

$$g = \frac{1}{2L} \ln \left[ \frac{(ZW + ZE1) \cdot (ZW - ZA1)}{(ZW - ZE1) \cdot (ZW + ZA1)} \right]$$

where

ZA1 = finite impedance for the first input impedance ZE1

ZA2 = finite impedance for the second input impedance ZE2

L = length of the two-port network ln = natural logarithm.

6. Method as claimed in claim 5, wherein:

at least three input impedances are measured with at least three different predetermined terminations;

from two input impedances each in each case a preliminary characteristic impedance and a preliminary propagation constant, respectively, are determined; and a final characteristic impedance and a final propagation constant, respectively, are obtained by averaging the preliminary characteristic impedances and preliminary propagation constants, respectively.

* * * * *